United States Patent [19]
Zarin et al.

[11] 3,962,652
[45] June 8, 1976

[54] SIMPLIFIED SURFACE ACOUSTIC WAVE SYNTHESIZER

[75] Inventors: Alvin Zarin, Deal Park; Francis A. Carbin, Neptune, both of N.J.

[73] Assignee: The United States of America as represented by the Secretary of the Army, Washington, D.C.

[22] Filed: Mar. 7, 1975

[21] Appl. No.: 556,365

[52] U.S. Cl. .............................. 331/1 R; 310/9.8; 331/9; 331/25; 331/107 A; 331/179; 333/30 R; 333/72
[51] Int. Cl.² ...................... H03B 3/04; H03B 5/30
[58] Field of Search............. 331/1 R, 9, 25, 107 A, 331/179; 333/30 R, 72; 310/9.8; 330/5.5

[56] References Cited
UNITED STATES PATENTS

| 3,582,540 | 6/1971 | Adler et al. | 331/107 A X |
| 3,648,081 | 3/1972 | Lean et al. | 333/30 R X |
| 3,775,696 | 11/1973 | Garth | 331/179 X |
| 3,818,382 | 6/1974 | Holland et al. | 310/9.8 X |

Primary Examiner—Siegfried H. Grimm
Attorney, Agent, or Firm—Nathan Edelberg; Robert P. Gibson; Arthur L. Bowers

[57] ABSTRACT

A highly stable variable frequency oscillator is disclosed which employs a multitap surface acoustic wave device as a frequency standard. A feedback path which includes a voltage controlled switch for selecting a desired output tap drives a differential amplifier, phase detector, low pass filter, voltage controlled oscillator and phase splitter for driving the input tap of the surface acoustic wave device. Various additional feedback paths are also employed. The variable frequency signal is taken from the output of the voltage controlled oscillator.

8 Claims, 1 Drawing Figure

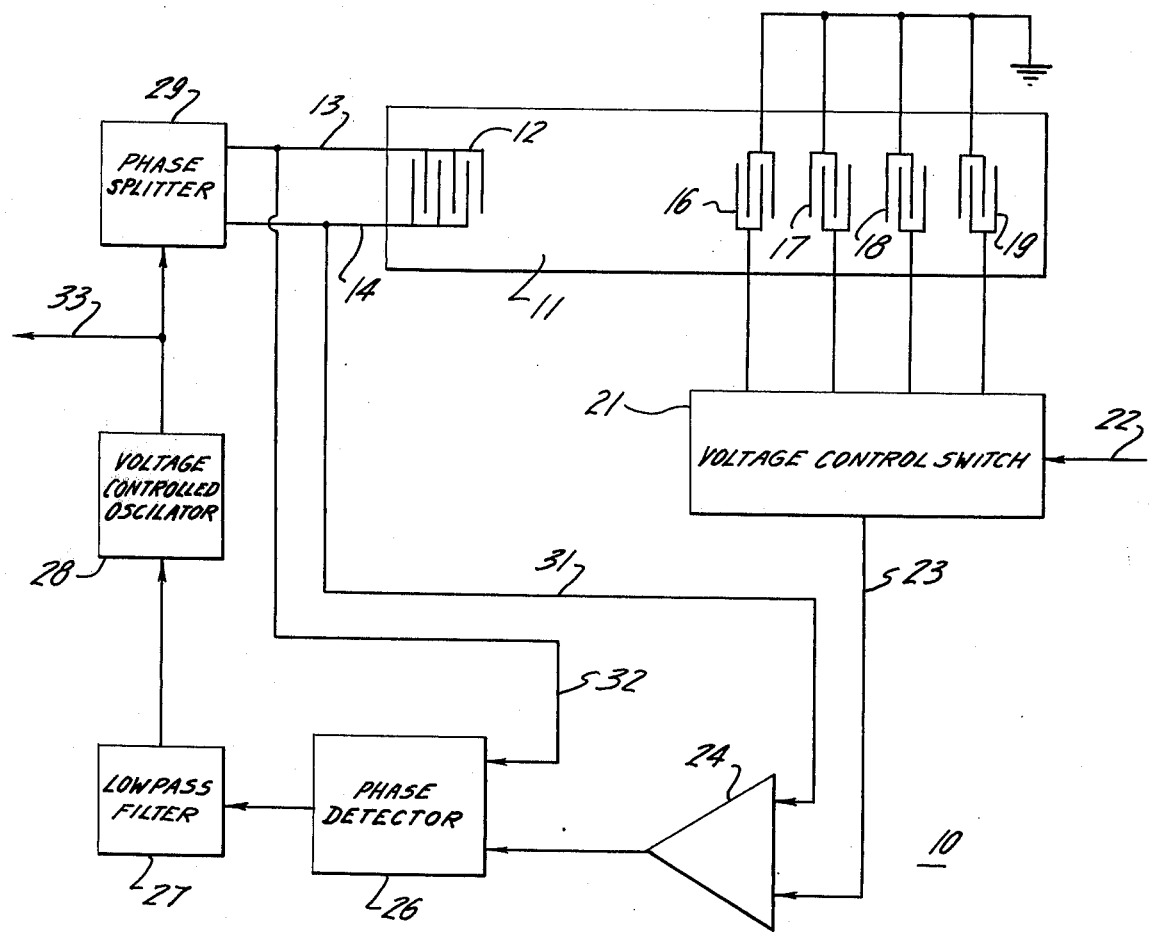

SIMPLIFIED SURFACE ACOUSTIC WAVE SYNTHESIZER

The invention described herein may be manufactured and used by or for the Government for governmental purposes without the payment of any royalties thereon or therefor.

FIELD OF THE INVENTION

This invention relates to variable frequency oscillators and particularly to highly stable variable frequency oscillators.

BACKGROUND OF THE INVENTION

Highly stable oscillators normally employ crystals as their basic frequency standard. In order to make a variable frequency oscillator with crystal oscillator stability, it is common to employ a plurality of crystal references. This is not only expensive but the switching between one crystal and another does not accommodate itself to rapid frequency changes.

Surface acoustic wave devices are well known as evidenced by the following publications: "Analysis of Interdigital Surface Wave Transducers by Use of an Equivalent Circuit Model" W. R. Smith et al IEEE Transactions on Microwave Theory and Techniques, M.T.T.-17, 856–864 November, 1969; "Design of Surface Wave Delay Lines With Interdigital Transducers" W. R. Smith et al, IEEE Transactions on Microwave Theory and Techniques, M.T.T.-17, 865–873, November 1969; "Impulse Model Design of Acoustic Surface Wave Filters" C. S. Hartman et al IEEE Transactions on Microwave Theory and Techniques, M.T.T.-21, 162–165 April, 1973, "Acoustic Surface Wave Filters" R. H. Tancrell et al proceedings of IEEE, 59, 393–409, March, 1971 and "The Design and Applications of Highly Dispersive Acoustic Surface Wave Filters" H. M. Gerard et al IEEE Transactions on Microwave Theory and Techniques, M.T.T.-21, 176–185, April 1973.

Some work has been done on employing surface acoustic wave devices in oscillators to substitute them for the heretofore used crystals. Much of the work done related to band width considerations of such oscillators and the use of such oscillators as modulators.

It is an object of this invention to provide a highly stable variable frequency oscillator.

It is a further object of this invention to provide a highly stable variable frequency oscillator using a single frequency standard.

It is still a further object of this invention to provide a highly stable variable oscillator which can be rapidly switched from one frequency to the other.

BRIEF DESCRIPTION OF THE INVENTION

With these and other objects in view the present invention contemplates a variable frequency oscillator which includes a surface acoustic wave device having an input transducer and at least first and second spaced output transducers. A switching device is employed for selectively connecting the first and second spaced-apart output transducers to the input terminal of an amplifier. The output of the amplifier drives the input transducer of the surface acoustic wave device.

In the preferred embodiment of the invention, the input transducer to the surface acoustic wave device is a differential transducer having first and second input transducer terminals and the amplifier is a differential amplifier, also having a second input terminal. A phase detector compares the output from the differential amplifier with the signal on one of the terminals of the input transducer. The other terminal of the input transducer is connected to the second input terminal of the differential amplifier. The phase detector drives a voltage controlled oscillator, the signal from which is impressed across the first and second input transducer terminals.

DESCRIPTION OF THE DRAWINGS

For a more complete understanding of the invention reference should be made to the following detailed description and drawing in which the sole FIGURE is a block diagram showing a system embodying the principles of this invention.

DETAILED DESCRIPTION OF THE INVENTION

Referring now to the sole FIGURE, we see a variable frequency oscillator 10 constructed in accordance with the teachings of this invention. The heart of the oscillator is a surface acoustic wave device 11 having an interdigital input transducer 12. The main body of the acoustic wave device 11 could be made of a piezoelectric crystal or from any of the materials commonly employed for such devices. The interdigital transducer 12 introduces surface acoustic waves onto the surface of the device when a voltage is impressed between the input transducer terminals 13 and 14. A plurality (in this instance 4) of interdigital output transducers 16 through 19 are spaced from the input transducer 12 and from each other. One side of each of the output transducers 16, 17, 18 and 19 is grounded. The other side of each of the output transducers 16, 17, 18 and 19 is connected to a voltage controlled switch 21. The voltage controlled switch may be, for example, a diode matrix or transistor bank which responds to a signal (either analogue or digital) on a lead 22 to connect one of the output transducers 16, 17, 18 or 19 to a lead 23. It, of course, should be understood that the voltage controlled switch 21 could be a manual switch.

The lead 23 connects the voltage controlled switch 21 to a first input of a differential amplifier 24. The differential amplifier 24 drives one input of a phase detector 26 which, in turn, drives a low pass filter 27. The output of the low pass filter 27 is fed as an input control signal to a voltage controlled oscillator 28. The output of the voltage controlled oscillator 28 is fed to a phase splitter 29 which drives the input transducer 12. The phase splitter 29 could be, for example, an amplifier having a double ended output such as a transistor having approximately equal resistance values in its emitter and collective circuits.

The terminal 14 of the input transducer 12 is connected via lead 31 as a second input to the differential amplifier 24 while the input terminal 13 of the input transducer 12 is connected via lead 32 as a second input to the phase detector 26.

In operation, the circuit 10 provides an output signal on a lead 33 having a frequency and phase primarily determined by the stable properties of the surface acoustic wave device 11. The frequency of oscillation is chosen by operation of the voltage controlled switch 21 by determining which of the output transducers 16, 17, 18, or 19 are connected to the lead 23. The circuit oscillates at a frequency and phase where the gain around the loop is equal to 1 with a phase shift of 360°.

The voltage controlled oscillator 28 provides an oscillatory signal through the phase splitter 29 which impresses this signal across the input transducer 12. The input transducer 12 sets up surface acoustic waves in the device 11 which are transmitted to the output transducers. The particular output transducer selected provides a signal to the lead 23 which is compared by the amplifier 24 to the signal on the terminal 14. The output of the differential amplifier 24, therefore, is dependent upon the phase shift between the signal on the input terminal 14 and the lead 23. This phase difference is compared to the phase of the signal on the input terminal 13 (which is 180° out of phase with the signal on the input terminal 14) filtered by the low pass filter 27 and employed as a control signal for the voltage controlled oscillator 28.

It is, of course, clear that as the different output transducers 16, 17, 18 and 19 are selected by the voltage control switch 21, the phase difference between the signal on the input terminal 14 and the lead 23 will change, thereby changing the control signal supplied to the voltage controlled oscillator.

To the extent that the phase shifts through the voltage control switch 21, the amplifier 24, the phase detector 26, the low pass filter 27, the voltage controlled oscillator 28 and the phase splitter 29 are small compared with the phase shift provided by the surface acoustic wave device 11, the frequency of oscillation will be determined by the surface acoustic wave device 11 which normally should be approximately 180°. As in conventional oscillators, the additional 180° phase shift to provide oscillation is provided by an inversion in one of the devices around a loop rather than a frequency sensitive phase shift.

The device in accordance with this invention could be constructed employing elements 11, 21 and 24 connected in a feedback arrangement as discussed. The additional elements shown in the drawing helps to stabilize the device so that the simpler device, while operating within the concepts of this invention, would provide more flutter.

The device as described above has the advantages of a crystal oscillator in that the frequency is determined by highly stable physical properties of the surface acoustic wave device 11 and yet has the advantage of being switchable because of the tapped arrangement.

While this invention has been described with respect to a particular embodiment thereof, numerous others will become obvious to those of ordinary skill in the art in light thereof.

What is claimed is:

1. A variable frequency oscillator including:
   a surface acoustic wave device having an input transducer and at least first and second spaced output transducers;
   an amplifier having a first input terminal and an output terminal;
   first means for connecting said output terminal of said amplifier to said input terminal of said transducer; and
   second means for selectively connecting said first and second spaced output transducers to said first input terminal of said amplifier.

2. The variable frequency oscillator as defined in claim 1 in which said input transducer is a differential transducer having first and second input transducer terminals and said amplifier is a differential amplifier also having a second input terminal; said first means including;
   a phase detector having first and second input ports and an output port;
   third means for connecting said output of said amplifier to said first input port;
   fourth means for connecting said first input transducer terminal to said second input port;
   a voltage controlled oscillator for providing an A. C. signal at the output thereof;
   fifth means for connecting said output port to drive said voltage controlled oscillator; and
   sixth means for impressing said A. C. signal across said first and second input transducer terminals; said variable frequency oscillator also including:
   seventh means for connecting said second input transducer terminal to said second input terminal of said differential amplifier.

3. The variable frequency oscillator as defined in claim 2 in which said fifth means include a low pass filter.

4. The variable frequency oscillator as defined in claim 3 in which said sixth means includes a phase splitting device.

5. The variable frequency oscillator as defined in claim 1 in which said second means is responsive to a signal applied thereto for selectively connecting said first and second spaced output transducers to said first input terminals of said amplifier.

6. The variable frequency oscillator as defined in claim 5 in which said input transducer is a differential transducer having first and second input transducer terminals and said amplifier is a differential amplifier also having a second input terminal; said first means including;
   a phase detector having first and second input ports and an output port;
   third means for connecting said output of said amplifier to said first input port;
   fourth means for connecting said first input transducer terminal to said second input port;
   a voltage controlled oscillator for providing an A. C. signal at the output thereof;
   fifth means for connecting said output port to drive said voltage controlled oscillator; and
   sixth means for impressing said A. C. signal across said first and second input transducer terminals; said variable frequency oscillator also including:
   seventh means for connecting said second input transducer terminal to said second input terminal of said differential amplifier.

7. The variable frequency oscillator as defined in claim 6 in which said fifth means includes a low pass filter.

8. The variable frequency oscillator as defined in claim 7 in which said sixth means includes a phase splitting device.

* * * * *